United States Patent
Henley et al.

(10) Patent No.: US 6,500,732 B1
(45) Date of Patent: *Dec. 31, 2002

(54) CLEAVING PROCESS TO FABRICATE MULTILAYERED SUBSTRATES USING LOW IMPLANTATION DOSES

(75) Inventors: Francois J. Henley, Aptos, CA (US); Michael A. Brayan, Los Gatos, CA (US); William G. En, Milpitas, CA (US)

(73) Assignee: Silicon Genesis Corporation, San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/626,532

(22) Filed: Jul. 27, 2000

Related U.S. Application Data

(60) Provisional application No. 60/148,107, filed on Aug. 10, 1999.

(51) Int. Cl.⁷ .......................... H01L 21/30; H01L 21/46
(52) U.S. Cl. .................... 438/459; 438/455; 156/344; 156/384
(58) Field of Search .................... 438/455, 458, 438/459; 156/344, 384; 29/426.4, 426.5, 762

(56) References Cited

U.S. PATENT DOCUMENTS

| | | |
|---|---|---|
| 2,614,055 A | 10/1952 | Senarelens |
| 3,117,022 A | 1/1964 | Bronson et al. |

(List continued on next page.)

FOREIGN PATENT DOCUMENTS

| | | |
|---|---|---|
| DE | 834 363 | 3/1952 |
| EP | 084 287 A1 | 7/1983 |
| EP | 099 778 A1 | 2/1984 |
| EP | 155 875 A1 | 2/1984 |
| EP | 112 238 A2 | 6/1984 |
| EP | 164 281 A1 | 12/1985 |
| EP | 112 230 A1 | 4/1987 |
| EP | 181 249 A1 | 6/1989 |
| EP | 355 913 A1 | 2/1990 |
| EP | 379 828 A2 | 8/1990 |
| EP | 459 177 A2 | 12/1991 |
| EP | 504 714 A2 | 9/1992 |
| EP | 533 551 A1 | 3/1993 |
| EP | 665 588 A1 | 2/1995 |
| EP | 660 140 A1 | 6/1995 |
| EP | 665 587 A1 | 8/1995 |
| EP | 703 609 A1 | 3/1996 |
| EP | 763 849 A1 | 3/1997 |

(List continued on next page.)

OTHER PUBLICATIONS

Alles et al., "Thin Film Silicon on Insulator: An Enabling Technology," *Semiconductor International*, pp. 67–72 (1997).

(List continued on next page.)

*Primary Examiner*—John F. Niebling
*Assistant Examiner*—Viktor Simkovic
(74) *Attorney, Agent, or Firm*—Townsend&Townsend&Crew LLP

(57) ABSTRACT

A method of forming substrates. The method includes providing a donor substrate; and forming a cleave layer comprising a cleave plane on the donor substrate. The cleave plane extends from a periphery of the donor substrate through a center region of the substrate. The method also includes forming a device layer on the cleave layer. The method also includes selectively introducing a plurality of particles along the periphery of the cleave plane to form a higher concentration region at the periphery and a lower concentration region in the center region. Selected energy is provided to the donor substrate to initiate a cleaving action at the higher concentration region at the periphery of the cleave plane to cleave the device layer at the cleave plane.

12 Claims, 15 Drawing Sheets

U.S. PATENT DOCUMENTS

| | | |
|---|---|---|
| 3,225,820 A | 12/1965 | Riordan |
| 3,390,033 A | 6/1968 | Brown |
| 3,551,213 A | 12/1970 | Boyle |
| 3,770,499 A | 11/1973 | Crowe et al. |
| 3,786,359 A | 1/1974 | King |
| 3,806,380 A | 4/1974 | Kitada et al. |
| 3,832,219 A | 8/1974 | Nelson et al. |
| 3,900,636 A | 8/1975 | Curry et al. |
| 3,901,423 A | 8/1975 | Hillberry et al. |
| 3,915,757 A | 10/1975 | Engel |
| 3,946,334 A | 3/1976 | Yonezu |
| 3,957,107 A | 5/1976 | Alotz et al. |
| 3,993,909 A | 11/1976 | Drews et al. |
| 4,006,340 A | 2/1977 | Gornais |
| 4,039,416 A | 8/1977 | White |
| 4,053,335 A | 10/1977 | Hu |
| 4,074,139 A | 2/1978 | Pankove |
| 4,107,350 A | 8/1978 | Berg et al. |
| 4,108,751 A | 8/1978 | King |
| 4,116,751 A | 9/1978 | Zaromb |
| 4,121,334 A | 10/1978 | Wallis |
| 4,170,662 A | 10/1979 | Weiss et al. |
| 4,216,906 A | 8/1980 | Olsen et al. |
| 4,237,601 A | 12/1980 | Woolhouse et al. |
| 4,244,348 A | 1/1981 | Wilkes |
| 4,252,837 A | 2/1981 | Auton |
| 4,255,208 A | 3/1981 | Deutscher et al. |
| 4,274,004 A | 6/1981 | Kanai |
| 4,342,631 A | 8/1982 | White et al. |
| 4,346,123 A | 8/1982 | Kaufmann |
| 4,361,600 A | 11/1982 | Brown |
| 4,368,083 A | 1/1983 | Bruel et al. |
| 4,375,125 A | 3/1983 | Byatt |
| 4,412,868 A | 11/1983 | Brown et al. |
| 4,452,644 A | 6/1984 | Bruel et al. |
| 4,468,309 A | 8/1984 | White |
| 4,471,003 A | 9/1984 | Cann |
| 4,486,247 A | 12/1984 | Ecer et al. |
| 4,490,190 A | 12/1984 | Speri |
| 4,500,563 A | 2/1985 | Ellenberger et al. |
| 4,508,056 A | 4/1985 | Bruel et al. |
| 4,536,657 A | 8/1985 | Bruel |
| 4,539,505 A | 9/1985 | Kramler et al. |
| 4,566,403 A | 1/1986 | Fournier |
| 4,567,505 A | 1/1986 | Pease et al. |
| 4,568,563 A | 2/1986 | Jackson et al. |
| 4,585,945 A | 4/1986 | Bruel et al. |
| 4,645,546 A | 2/1987 | Matsushita |
| 4,684,535 A | 8/1987 | Heinecke et al. |
| 4,704,302 A | 11/1987 | Bruel et al. |
| 4,706,377 A | 11/1987 | Shuskus |
| 4,717,683 A | 1/1988 | Parillo et al. |
| 4,727,047 A | 2/1988 | Bozler et al. |
| 4,764,394 A | 8/1988 | Conrad |
| 4,766,086 A | 8/1988 | Ohshima et al. |
| 4,837,172 A | 6/1989 | Mizuno et al. |
| 4,846,928 A | 7/1989 | Dolins et al. |
| 4,847,792 A | 7/1989 | Bama et al. |
| 4,853,250 A | 8/1989 | Boulos et al. |
| 4,883,561 A | 11/1989 | Gmitter et al. |
| 4,887,005 A | 12/1989 | Rough et al. |
| 4,891,329 A | 1/1990 | Reisman et al. |
| 4,894,709 A | 1/1990 | Phillips et al. |
| 4,931,405 A | 6/1990 | Kamijo et al. |
| 4,948,458 A | 8/1990 | Ogle |
| 4,952,273 A | 8/1990 | Popov |
| 4,856,693 A | 9/1990 | Sawahata et al. |
| 4,960,073 A | 10/1990 | Suzuki et al. |
| 4,982,090 A | 1/1991 | Wittmaack |
| 4,983,251 A | 1/1991 | Haisma et al. |
| 4,996,077 A | 2/1991 | Moslehi |
| 5,015,353 A | 5/1991 | Hubler et al. |
| 5,034,343 A | 7/1991 | Rouse et al. |
| 5,070,040 A | 12/1991 | Pankove |
| 5,082,793 A | 1/1992 | Li |
| 5,102,821 A | 4/1992 | Moslehi |
| 5,110,748 A | 5/1992 | Sarma |
| 5,133,826 A | 7/1992 | Dandl |
| 5,162,241 A | 11/1992 | Mori et al. |
| 5,196,355 A | 3/1993 | Wittkower |
| 5,198,371 A | 3/1993 | Li |
| 5,202,095 A | 4/1993 | Houchin et al. |
| 5,203,960 A | 4/1993 | Dandl |
| 5,206,749 A | 4/1993 | Zavracky et al. |
| 5,213,451 A | 5/1993 | Frank |
| 5,234,529 A | 8/1993 | Johnson |
| 5,234,535 A | 8/1993 | Beyer et al. |
| 5,242,861 A | 9/1993 | Inaba |
| 5,250,328 A | 10/1993 | Otto |
| 5,252,178 A | 10/1993 | Moslehi |
| 5,256,562 A | 10/1993 | Vu et al. |
| 5,258,320 A | 11/1993 | Zavracky et al. |
| 5,258,325 A | 11/1993 | Spitzer et al. |
| 5,269,880 A | 12/1993 | Jolly et al. |
| 5,273,610 A | 12/1993 | Thomas, II et al. |
| 5,277,748 A | 1/1994 | Sakaguchi et al. |
| 5,303,574 A | 4/1994 | Matossian et al. |
| 5,304,509 A | 4/1994 | Sopori |
| 5,308,776 A | 5/1994 | Gotou |
| 5,317,236 A | 5/1994 | Zavracky et al. |
| 5,342,472 A | 8/1994 | Imahashi et al. |
| 5,344,524 A | 9/1994 | Sharma et al. |
| 5,354,381 A | 10/1994 | Sheng |
| 5,362,671 A | 11/1994 | Zavracky et al. |
| 5,363,603 A | 11/1994 | Miller et al. |
| 5,368,710 A | 11/1994 | Chen et al. |
| 5,370,765 A | 12/1994 | Dandl |
| 5,374,564 A | 12/1994 | Bruel |
| 5,376,560 A | 12/1994 | Aronowitz et al. |
| 5,377,031 A | 12/1994 | Vu et al. |
| 5,404,079 A | 4/1995 | Ohkuni et al. |
| 5,405,480 A | 4/1995 | Benzing et al. |
| 5,411,592 A | 5/1995 | Ovshinsky et al. |
| 5,413,679 A | 5/1995 | Godbey |
| 5,435,880 A | 7/1995 | Minato et al. |
| 5,438,241 A | 8/1995 | Zavracky et al. |
| 5,443,661 A | 8/1995 | Oguro et al. |
| 5,444,557 A | 8/1995 | Spitzer et al. |
| 5,459,016 A | 10/1995 | Debe et al. |
| 5,475,514 A | 12/1995 | Salerno et al. |
| 5,476,691 A | 12/1995 | Komvopoulos et al. |
| 5,480,842 A | 1/1996 | Clifton et al. |
| 5,487,785 A | 1/1996 | Horiike |
| 5,494,835 A | 2/1996 | Bruel |
| 5,504,328 A | 4/1996 | Bonser |
| 5,528,397 A | 6/1996 | Zavracky et al. |
| 5,539,245 A | 7/1996 | Imura et al. |
| 5,558,718 A | 9/1996 | Leung |
| 5,559,043 A | 9/1996 | Bruel |
| 5,569,620 A | 10/1996 | Linn et al. |
| 5,581,385 A | 12/1996 | Spitzer et al. |
| 5,585,304 A | 12/1996 | Hayashi et al. |
| 5,611,855 A | 3/1997 | Wijaranakula |
| 5,643,834 A | 7/1997 | Harada et al. |
| 5,653,811 A | 8/1997 | Chan |
| 5,705,421 A | 1/1998 | Matsushita et al. |
| 5,710,057 A | 1/1998 | Kenny |
| 5,714,395 A | 2/1998 | Bruel |
| 5,744,852 A | 4/1998 | Linn et al. |
| 5,753,560 A | 5/1998 | Hong et al. |
| 5,755,914 A | 5/1998 | Yonehara |

| | | | |
|---|---|---|---|
| 5,763,319 A | 6/1998 | Ling et al. | |
| 5,783,022 A | 7/1998 | Cha et al. | |
| 5,804,086 A | 9/1998 | Bruel | |
| 5,821,158 A | 10/1998 | Shishiguchi | |
| 5,824,595 A | 10/1998 | Igel et al. | |
| 5,827,751 A | 10/1998 | Nuyen | |
| 5,840,590 A | 11/1998 | Myers, Jr. et al. | |
| 5,854,123 A | 12/1998 | Sato et al. | |
| 5,869,387 A | 2/1999 | Sato et al. | |
| 5,877,070 A | 3/1999 | Goesele et al. | |
| 5,882,987 A | 3/1999 | Srikrishnan | |
| 5,909,627 A | 6/1999 | Egloff | |
| 5,920,764 A | 7/1999 | Hanson et al. | |
| 5,953,622 A | 9/1999 | Lee et al. | |
| 5,966,620 A | 10/1999 | Sakaguchi et al. | |
| 5,985,742 A | 11/1999 | Henley et al. | |
| 5,993,677 A | 11/1999 | Biasse et al. | |
| 5,994,207 A | 11/1999 | Henley et al. | |
| 6,010,579 A | 1/2000 | Henley et al. | |
| 6,013,563 A | 1/2000 | Henley et al. | |
| 6,013,567 A | 1/2000 | Henley et al. | |
| 6,020,252 A | 2/2000 | Aspar et al. | |
| 6,033,974 A | 3/2000 | Henley et al. | |
| 6,048,411 A | 4/2000 | Henley et al. | |
| 6,077,383 A | 6/2000 | Laporte | |
| 6,083,324 A * | 7/2000 | Henley et al. | 148/33.2 |
| 6,120,597 A | 9/2000 | Levy et al. | |
| 6,150,239 A | 11/2000 | Goesele et al. | |
| 6,159,824 A | 12/2000 | Henley et al. | |
| 6,171,965 B1 * | 1/2001 | Kang et al. | 438/695 |
| 6,184,111 B1 * | 2/2001 | Henley et al. | 438/514 |
| 6,190,998 B1 | 2/2001 | Bruel et al. | |
| 6,191,007 B1 | 2/2001 | Matsui et al. | |
| 6,214,701 B1 | 4/2001 | Matsushita et al. | |
| 6,225,192 B1 | 5/2001 | Aspar et al. | |

FOREIGN PATENT DOCUMENTS

| | | |
|---|---|---|
| EP | 807 970 A1 | 11/1997 |
| EP | 867 917 A2 | 9/1998 |
| EP | 867 921 A2 | 9/1998 |
| EP | 961 312 A2 | 12/1999 |
| FR | 1558881 | 1/1969 |
| FR | 2261802 A1 | 2/1974 |
| FR | 2235474 A1 | 4/1974 |
| FR | 2298880 | 1/1975 |
| FR | 2266304 | 4/1975 |
| FR | 2519437 A1 | 1/1982 |
| FR | 2529383 A1 | 6/1982 |
| FR | 2560426 A1 | 2/1984 |
| FR | 2563377 A1 | 4/1984 |
| FR | 2537777 A1 | 12/1984 |
| FR | 2575601 A1 | 12/1984 |
| FR | 2681472 A1 | 9/1991 |
| FR | 2537768 A1 | 8/1992 |
| FR | 2714524 A1 | 12/1993 |
| FR | 2715501 A1 | 1/1994 |
| FR | 2715502 A1 | 1/1994 |
| FR | 2715503 A1 | 1/1994 |
| FR | 2720189 A1 | 5/1994 |
| FR | 2725074 A1 | 9/1994 |
| GB | 2 211 991 A | 7/1989 |
| GB | 2 231 197 A | 11/1990 |
| JP | 60-235434 A | 11/1958 |
| JP | 53-104156 A | 9/1978 |
| JP | 58-144475 A | 8/1983 |
| JP | 60-083591 A | 10/1983 |
| JP | 59-019394 A | 1/1984 |
| JP | 59-046750 A | 3/1984 |
| JP | 59-054217 A | 3/1984 |
| JP | 59-114744 A | 7/1984 |
| JP | 59-139539 A | 8/1984 |
| JP | 59-193904 A | 11/1984 |
| JP | 60-207237 A | 10/1985 |
| JP | 4-076503 A | 7/1990 |
| JP | 3-109731 A | 5/1991 |
| JP | 3-132055 A | 6/1991 |
| JP | 3-265156 A | 11/1991 |
| JP | 4-246594 A | 9/1992 |
| JP | 4-298023 A | 10/1992 |
| JP | 5-211128 A | 8/1993 |
| JP | 7-215800 A | 8/1995 |
| JP | 7-254690 A | 10/1995 |
| JP | 7-263291 A | 10/1995 |
| JP | 8-097389 A | 4/1996 |
| JP | 10-200080 A | 7/1998 |
| JP | 11-045840 A | 2/1999 |
| JP | 2901031 B2 | 6/1999 |
| JP | 2910001 B2 | 6/1999 |
| JP | 2000-94317 A | 4/2000 |
| WO | WO 95/10718 A1 | 4/1995 |
| WO | WO 95/20824 A1 | 8/1995 |
| WO | WO 95/31825 A1 | 11/1995 |
| WO | WO 99/35674 A1 | 7/1999 |

OTHER PUBLICATIONS

Burggraff, P., "Advanced Plasma Source: What's Working?" *Semiconductor International*, pp. 56–59 (May 1994).

Basta, N., "Ion–Beam Implantation," *High Technology*, (1985).

Carter et al., "The Collection of Ions Implanted in Semiconductors II. Rnage distributions Derived from Collection and Sputter–Etch Curves," *Radiation Effects*, 16:107–114 (1972).

Cassidy, Victor M., "Ion Implantation Process Toughens Metalworking Tools," *Modern Metals*, pp. 65–67 (1984).

Cheung, N.W., "Plasma Immersion Ion Implantation for Semiconductor Processing," *Material Chemistry and Physics*, 46(2–3): 132–139 (1996).

Choyke et al., "Mechanical Response of Single Crystal Si to Very High Fluence H+ Implantation," *Nuc. Instr. Meth.*, 209–210:407–412 (1983).

Choyke et al., "Implanted Hydrogen Effects at High Concentrations in Model Low Z Shielding Materials," *J. Nuc. Mtrls.*, 122–23:1585–86 (1984).

Choyke et al., "A Comparative Study of Near–Surface Effects Due to Very High Fluence H+ Implantation in Single Crystal FZ, CZ, and Web SI," *Mat. Res.Soc. Symp. Proc.*, 27:359–364 (1984).

Chu et al., "Plasma Immersion Ion Implantation—A Fledgling Technique for Semiconductor Processing," *Materials Science and Engineering Reports: A Review Journal*, R17(6–7): 207–280 (1996) cover page and table of contents only.

Chu et al., "Recent Applications of Plasma Immersion Ion Implantation," *Semiconductor International*, pp. 165–172 (1996).

Chu, Paul K., "Synthesis of SOI Materials Using Plasma Immersion Ion Implantation," *1997 Mat. Res. Soc. Symp. Proc.*, 438:333–343 (1997).

Corbett et al., "Embrittlement of Materials: Si(H) as a Model System," *J. Nuc. Mtrls.*, 169: 179–184 (1989).

Hulett, D.M. et al., "Ion Nitriding and Ion Implantation: A Comparison," *Metal Progress*, pp. 18–21 (1985).

I.B.M. Technical Disclosure Bulletin, vol. 29: No. 3, p. 1416 (Aug. 1986).

Johnson et al., "Hydrogen–Induced Platelets in Silicon: Separation of Nucleation and Growth," *Mtrls. Sci. Forum*, 83–87:33–38 (1992).

Lee et al., "A Novel Pattern Transfer Process for Bonded SOI Giga–bit DRAMS," *1996 IEEE Int'l. SOI Conference Proceedings, IEEE Electron Devices Society*, (1996).

LI, J., "Novel Semiconductor Substrate Formed by Hydrogen Ion Implantation into Silicon," *Appl. Phys. Lett.*, 55(21):2223–2224 (1989).

Lu et al., "SOI Material Technology Using Plasma Immersion Ion Implantation," *Proceedings 1996 IEEE International SOI Conference* (Oct. 1996).

Mahajan et al., *Principles of Growth and Processing of Semiconductors*, WCB McGraw–Hill, chapter 6, pp. 262–269.

Matsuda et al., "Large Diameter Ion Beam Implantation System," *Nuclear Instruments and methods*, B21:314–316 (1987).

Milnes et al., "Peeled Film Technology for solar Cells," pp. 338–341.

Moreau, Wayne M., *Semiconductor Lithography, Principles, Practices, and Materials*, Plenum Press (1988).

Oshima et al., "Defects in Si irradiated with D–T neutrons, D and He ions," *J. Nuc. Mtrls.*, 179–181:947–950 (1991).

*Patent Abstracts of Japan*, vol. 7, No. 107 (E–174), (May 11, 1993) JP–58–030145 (Feb. 22, 1983).

Picraux et al., "Ion Implantation of Surfaces," *Scientific American*, 252(3):102–113 (1985).

Reiner et al., "A New Low–Energy Ion Implanter for Bombardment of Cylindrical Sufaces," *Vacuum*, 35(12):577–578 (1985).

Sioshansi, Piran, "Ion Beam Modification of Materials for Industry," *Thin Solid Film*, 118:61–71 (1984).

Smith, D.L., *Thin–Film Deposition*, McGraw–Hill, Inc., pp. 185–196, 278–293.

Tong et al., "A 'smarter–cut' approach to low temperature silicon layer transfer," *Appl. Phys. Lett.*, 72(1):49–51 (1998).

Tong et al., *Semiconductor Wafer Bonding: Science and Technology*, John Wiley & Sons, Inc., pp. 152–171.

Wolf, Stanley Ph.D., *Silicon Processing for the VLSI Era vol. 2*, pp. 66–79, Lattice Press (1990).

U.S. Dept. of Energy, "The Fusion Connection: . . . ", *Plasma Coating*, pp. 6–7 (1985).

Veldkamp et al., Binary Optics, *Scientific American*, pp. 50–55 (May 1992).

Grovenor, C.R.M., *Microelectronic Materials*, pp. 73–75 (1989).

Sze, S.M., *VLSI Technology*, 2nd Edition, pp. 9–10, (1988).

* cited by examiner

CLEAVING PROCESS TO FABRICATE MULTILAYERED SUBSTRATES USING LOW IMPLANTATION DOSES

CROSS REFERENCES TO RELATED APPLICATIONS

This application claims priority to U.S. Provisional Application No. 60/148,107 filed Aug. 10, 1999, incorporated by references for all purposes.

BACKGROUND OF THE INVENTION

The present invention relates to the manufacture of objects. More particularly, the invention provides a technique including a method and device for cleaving a substrate in the fabrication of a multi-layered substrate for semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Many ways of fabricating substrates for the manufacture of integrated circuits have been proposed. In the early days, conventional integrated circuits were fabricated on "bulk" silicon wafers. These bulk silicon wafers were generally single crystal and formed using a process called Czochralski, which is known as CZ. The CZ process melts a batch of silicon metal in a crucible. A seed crystal is used as a starting material to pull a silicon ingot from the melt in the crucible. The ingot is then cut and polished to form the bulk silicon wafers.

Although bulk silicon wafers are widely used today, many such wafers have been replaced by other types. These other types of wafers include, among others, epitaxial silicon wafers, silicon-on-insulator wafers, and the like. High purity applications often require the use of epitaxial silicon wafers. These applications often produce lower yields on CZ wafers so such epitaxial silicon wafers are desirable. High purity applications include the manufacture of high density memory devices, high voltage devices, and microprocessor devices.

Some applications also use silicon on insulator wafers. These wafers generally include a silicon material layer, where devices are to be formed, overlying an insulating layer, commonly made of silicon dioxide, which overlies a bulk substrate material. Silicon on insulator wafers, which are known as SOI wafers, are made using one of many techniques. A common technique for making such wafer is "separation by ion implantation of oxygen," also termed as SIMOX. These SIMOX wafers are often made by implanting high doses of oxygen impurities into a silicon substrate, where the oxygen is later annealed to create an insulating layer underlying a surface of the silicon substrate. An active device layer is defined overlying such insulating layer. SIMOX wafers, however, have numerous limitations. For example, SIMOX wafers are often difficult to make in an efficient manner, since the high doses often require a long implantation time. Implantation is generally an expensive operation in the manufacture of wafers. Additionally, implantation of oxygen often causes damage to the device layer. Such damage can influence the operation and reliability of integrated circuit devices that are fabricated onto the device layer.

Accordingly, other ways of developing SOI wafers have been proposed. One such way is a "blistering" method for film separation known as Smart Cut™. Such blistering technique is described in detail in U.S. Pat. No. 5,374,564, in the name of Bruel ("Bruel '564"). This thermal blistering technique for manufacturing SOI wafers has many limitations. For high volume production, the high doses of hydrogen often requires the use of many ion implanters, which are expensive and difficult to maintain. Additionally, thermal blistering often creates rough surface finishes, which can produce worthless scrap product. European Application No. EP 0807970A1 ("Bruel '970"), which is also in the name of Bruel, suggests an improved method to the Bruel '564 patent of forming SOI wafers. Bruel '970 suggests a method of mechanically separating a layer having microcavities or microbubbles. Although the Bruel '970 suggests that the dose are generally lower than a minimum causing surface blistering, the doses of hydrogen should still be sufficiently high to allow microcavity and microbubble coalescence through a subsequent heat treatment process. Such thermal treatment process would often require a high temperature, which would lead to an exceedingly rough and imprecise fracture morphology along the microcavity plane. Accordingly, the Bruel '970 also requires high temperatures, which are generally undesirable and lead to excessive surface roughness characteristics.

Still another variation is described in U.S. Pat. No. 5,882,987, which is assigned to International Business Machines Corporation, and in the name of Srikrishnan, Kris V ("Srikrishnan"). Srikrishnan suggests an improvement to the blistering technique taught by the Bruel '564 patent. Here, Srikrishnan suggests an etch-stop layer within a device layer to be released. Additionally, Srikrishnan suggests implanting a large dose of hydrogen to allow separation using the aforementioned "blistering" process to separate the film at a location away from the etch-stop layer, thereby resulting in a structure characterized by the device layer covered by the etch-stop layer and a top surface layer and then selectively removing both layers. This process, which may be advantageous by reducing or eliminating the need for a chemical-mechanical polishing (CMP) step, still generally requires the use of the blistering process, high doses of hydrogen or rare gas ion implantation, and complicated chemical removals.

Yet another method for forming SOI wafers has been described in U.S. Pat. No. 5,854,123, which is assigned to Canon Kabushiki Kaisha, and in the names of Sato, et al ("Sato"). The Sato patent suggests releasing an epitaxial layer, which has been formed on a porous silicon layer. The porous silicon layer is generally made to release the epitaxial layer by providing a high degree of etch selectivity between the epitaxial silicon layer and the porous silicon layer. Unfortunately, this technique is often complicated and expensive. Moreover, epitaxial growth on a porous layer can compromise the quality of the epitaxial film by the introduction of defects into it, which is very undesirable. Other limitations can also exist with such technique.

Accordingly, a pioneering technique made by a company called Silicon Genesis Corporation has been developed. Such technique relies upon a controlled cleaving process, which is known as CCP, to manufacture SOI wafers and other structures. The CCP technique produces improved films using a room temperature process to cleave films. The room temperature process is generally free from microbubbles or microcavities, which may lead to blisters and the like caused by the conventional process described in Bruel. Although overcoming many limitations in conventional techniques, CCP can still be improved.

From the above, it is seen that an improved method for manufacturing substrates is highly desirable.

SUMMARY OF THE INVENTION

According to the present invention, a technique including a method and device for manufacturing objects is provided. In an exemplary embodiment, the present invention provides a method for fabricating multilayered substrates from a cleaving process. Such substrates use low doses of particles, which are used to create stress in a cleaving layer. The low doses of particles improve film quality and efficiency of the present method.

In a specific embodiment, the present invention provides a method of forming substrates. The method includes providing a donor substrate; and forming a cleave layer comprising a cleave plane on the donor substrate. The cleave plane extends from a periphery of the donor substrate through a center region of the substrate. The method also includes forming a device layer on the cleave layer. The method also includes selectively introducing a plurality of particles along the periphery of the cleave plane to form a higher concentration region at the periphery and a lower concentration region in the center region. Selected energy is provided to the donor substrate to initiate a cleaving action at the higher concentration region at the periphery of the cleave plane to cleave the device layer at the cleave plane.

Numerous benefits are achieved over pre-existing techniques using the present invention. In particular, the present invention uses controlled energy and selected conditions to preferentially cleave a thin film of material from a donor substrate which includes multi-material sandwiched films. This cleaving process selectively removes the thin film of material from the substrate while preventing a possibility of damage to the film or a remaining portion of the substrate. In other aspects, the process also provides a multilayered substrate structure, which can be reused without substantial damage. Accordingly, the remaining substrate portion can be re-used repeatedly for other applications. Still further, the method provides smoother films (e.g., less than 30 or 20 or 10 or 5 or 3 or 2 Angstroms RMS) upon cleaving. Depending upon the application, one or more of these advantages may exist.

The present invention achieves these benefits and others in the context of known process technology. However, a further understanding of the nature and advantages of the present invention may be realized by reference to the latter portions of the specification and attached drawings.

DESCRIPTION OF THE SPECIFIC EMBODIMENTS

According to the present invention, a technique including a method and device for manufacturing objects is provided. In an exemplary embodiment, the present invention provides a method for reclaiming substrates from a cleaving process. Such reclaimed substrates can be reused for the manufacture of other substrates and the like.

Figure 1:
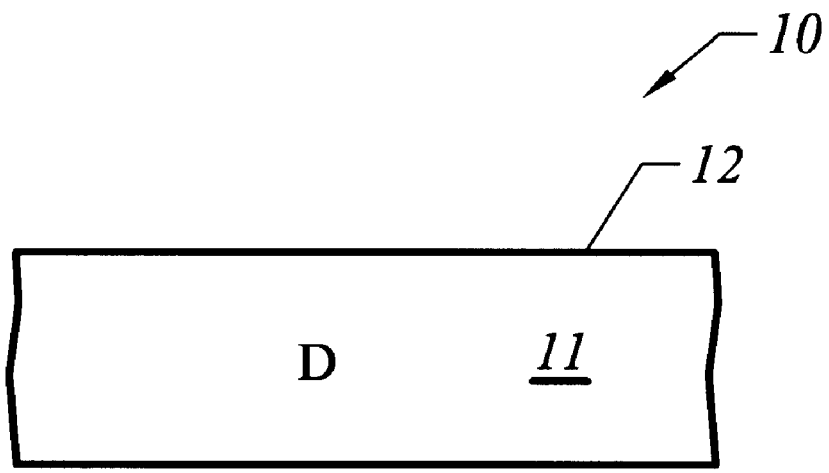
FIGS. 1–15 are simplified diagrams of methods according to embodiments of the present invention.

FIGS. 1–15 are simplified diagrams of methods according to embodiments of the present invention. These diagrams are merely examples which not unduly limit the scope of the claims herein. One of ordinary skill in the art would recognize many other variations, modifications, and alternatives. Referring to FIG. 1, the present method begins by providing a substrate 10. The substrate can be any suitable substrate such as a silicon wafer (e.g., bulk, multilayered) and others. The substrate 11 has a top surface, which is substantially planar in this application. Other forms can also exist.

Figure 2:
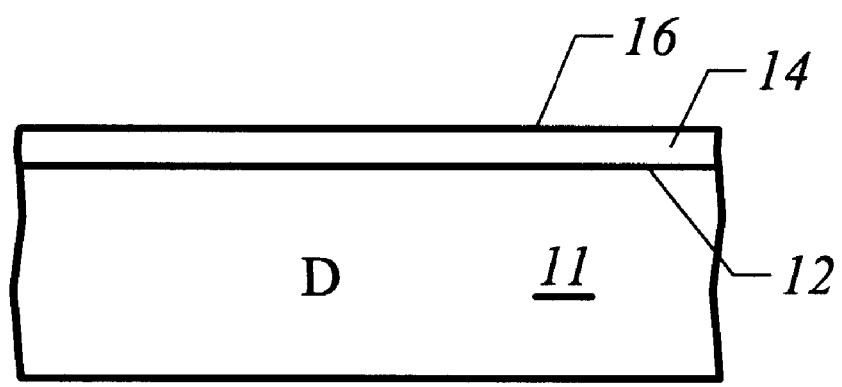

Optionally, a stop layer 14 is defined overlying the top surface of the substrate, as shown in FIG. 2. The stop layer can be any suitable material that protects substrate 11 and in particular surface 12 of substrate 11. The stop layer can be an epitaxial silicon layer made using a chemical vapor deposition process. The layer can be doped or undoped. If doped, the layer can be graded or constantly doped. The chemical vapor deposition process can include silane and hydrogen bearing gases. Other gases can also be used. These gases are introduced into an epitaxial chamber such as those made by Applied Materials, Inc. of Santa Clara, Calif. Alternatively, the chamber can be made by ASM International of Phoenix, Ariz. The stop layer can also be a combination of layers, which are doped or undoped. The stop layer can be a physical deposition layer or a plated layer or the like.

Figure 3:
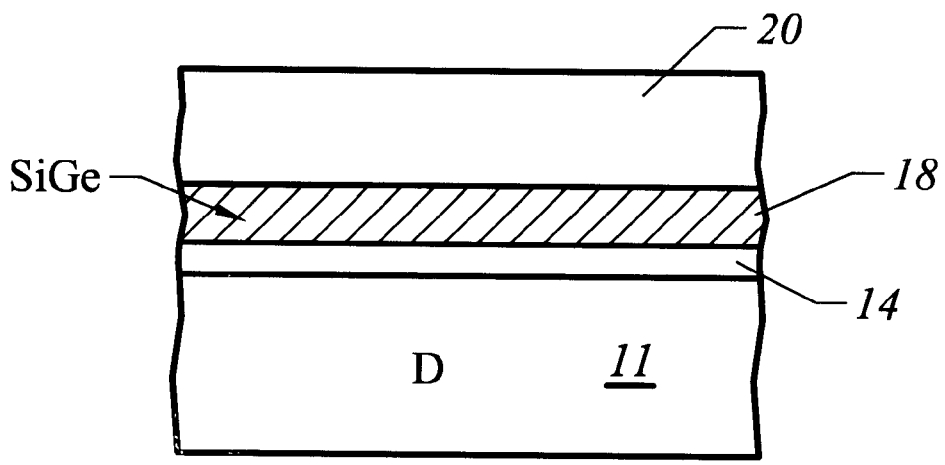

Next, the process includes forming a cleaving layer 18 overlying the stop layer 14, as shown in FIG. 3. The cleaving layer can be made by any suitable material that enhances cleaving. The cleaving layer can be deposited by one or a combination of techniques such as chemical vapor deposition, physical vapor deposition, plating, or the like. In a specific embodiment, the cleaving layer is a silicon germanium layer. The silicon germanium layer is often made to a thickness that enhances cleaving. The silicon germanium layer can also be replaced by other layers, which enhance cleaving. Some of these layers have been described in application Ser. No. 09/370,975, commonly assigned, and hereby incorporated by reference.

In a preferred embodiment, the silicon germanium layer is grown in a manner where it is stable. That is, the silicon germanium is an epitaxial layer in a pseudomorphic state. The silicon germanium is not grown in a manner to create roughening or misfit dislocations. In the present embodiment, a device layer is grown over the silicon germanium to enhance stability. That is, silicon germanium, which may be in a meta stable state, is now in a stable state due to the device layer or capping layer. Details of such device layer are provided below.

Overlying the silicon germanium layer is a device layer 20, also shown in FIG. 3. The device layer is a region where active devices or structures are to be formed in a subsequent process or processes. The device layer is made of a suitable material such as silicon, for example. The device layer can be an epitaxial silicon layer. The epitaxial silicon layer is made overlying the silicon germanium layer in a manner where the device layer is substantially free from defects. Here, a high quality stop layer often provides an ideal source for nucleation and growth of the silicon-germanium and the overlying epitaxial silicon layers. The epitaxial silicon layer is made using a chemical vapor deposition process. The chemical vapor deposition process can include silane and hydrogen bearing gases. These gases are introduced into an epitaxial chamber such as those made by Applied Materials, Inc. of Santa Clara, Calif. Alternatively, the chamber can be made by ASM International of Phoenix, Ariz. Depending upon the application, there can be an other layer(s) sandwiched between the stop layer and the cleaving layer. Additionally, there can be an other layer(s) sandwiched between the cleaving layer and the device layer in some applications.

Figure 3A:
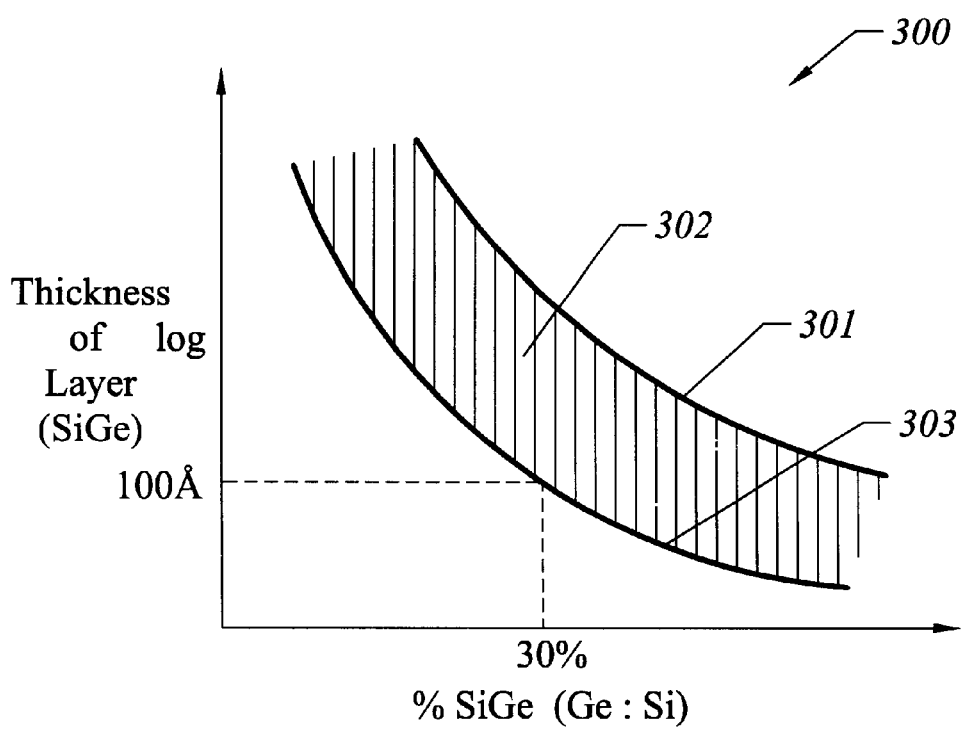

Preferably, the device layer acts as a capping layer over the cleaving layer. The capping layer can improve stability of the cleaving layer, which is stressed due to differences in crystalline structure from the stop layer or substrate. An increase in temperature of such cleaving layer also adds to the stress, where a temperature above a critical temperature for a certain film thickness creates an unstable film. In a specific embodiment, the capping layer of epitaxial silicon improves stability of the cleaving layer, in a manner shown in FIG. 3A. Here, thickness of silicon germanium is plotted on a vertical axis against concentration of germanium to silicon on a horizontal axis. Two plots are indicated (where the silicon germanium is grown at about 550 degrees Celsius). The plot referenced as numeral 303 is shown for a silicon germanium layer, which is not capped. That is, there is no layer overlying the silicon germanium layer. According to the plot 303, about 100 Angstroms (or 80 Angstroms) of a 30% germanium mixture of silicon germanium can be grown. Region 302, which is between the two curves, is a meta stable region, where any increase in temperature from 550 degrees Celsius of the film causes an unstable condition. When the layer is capped, however, the silicon germanium layer can be grown much thicker as shown by the curve in reference numeral 301. The capped layer allows the silicon germanium to be grown to a thickness of about 1.5 times or more than two times the thickness of the uncapped layer, while still maintaining a stable condition during subsequent processing, such as thermal treatment (e.g., over 400 degrees Celsius) and the like.

Figure 3B:
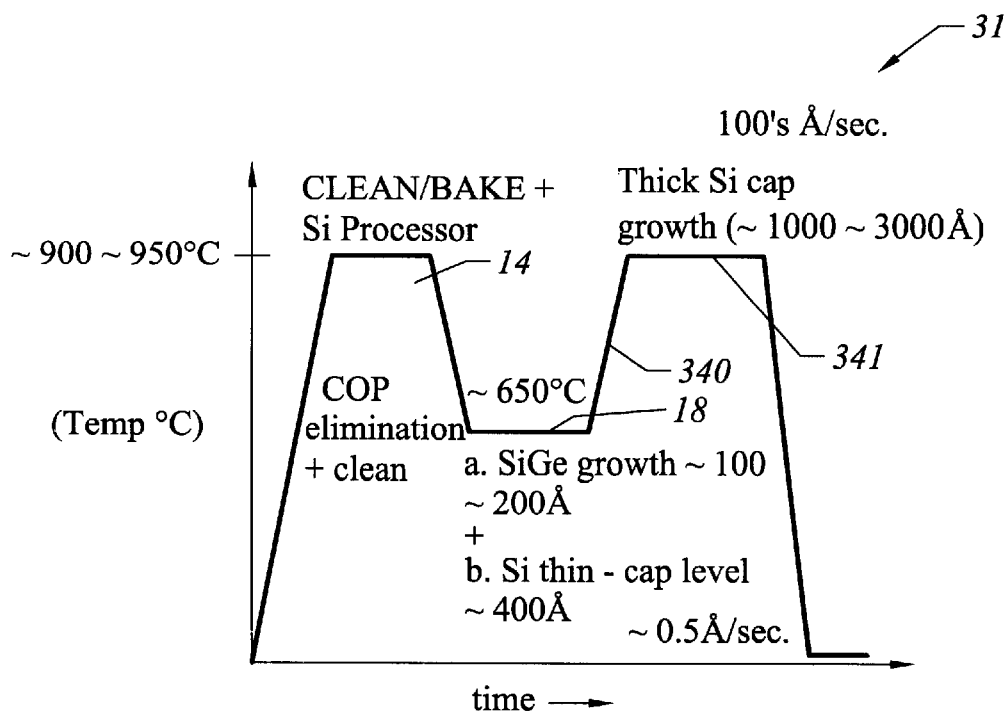
Figure 3C:
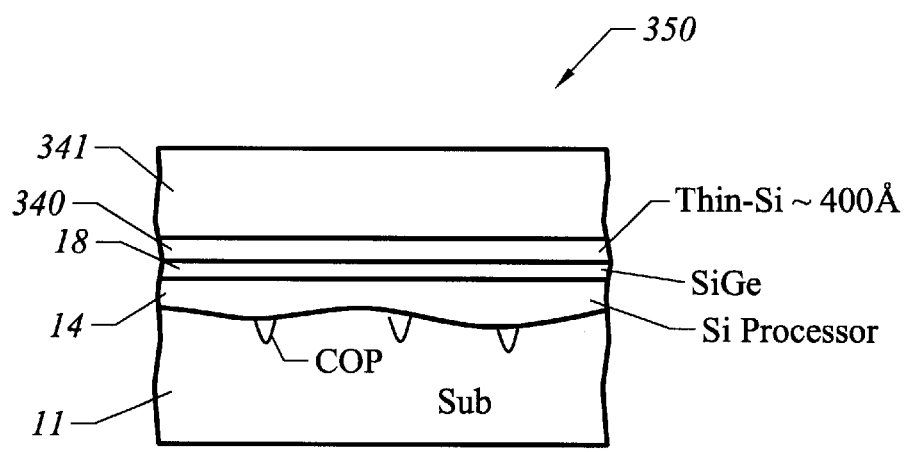

In a specific embodiment, the present method provides a higher temperature during growth of the device layer to improve device fabrication times. Here, the device 350 in FIGS. 3B and 3C is being fabricated. Like reference numerals are used in this FIG. as the previous FIGS. for cross-referencing purposes only. The device fabricated includes substrate 11, stop layer 14, cleave layer 14, and device layer 340, 341. In a specific embodiment, the substrate 11 is provided. The device also is subject to the temperature profile 310, illustrated in FIG. 3B. It is cleaned using a clean and bake process, if desired. The stop layer, which is epitaxial silicon, is formed overlying the substrate. The epitaxial silicon is formed at a first temperature, which can be about 900 to 950 degrees Celsius. Such first temperature and epitaxial silicon fills any defects in the substrate such as crystal originated particles, which are called "COPs" and the like. The first temperature is also high enough to provide a deposition rate that is efficient for manufacturing.

Next, the cleaving layer is formed at a second temperature, which is less than the first temperature. The second temperature is a temperature where a cleaving layer such as silicon germanium is stable. Such a temperature can be about 650 degrees Celsius or less for a 100 to 200 Angstroms or so layer for 30% germanium in silicon, where the silicon germanium is uncapped. The layer can be grown to a thickness, where the silicon germanium is still stable. A device layer is formed in at least two steps or can be formed where it undergoes higher temperature growth during a portion of such formation to decrease growth time. Initially, the device layer is formed at the second temperature to maintain stability in the cleave layer. In a specific embodiment, epitaxial silicon is formed to a thickness of about 350 Angstroms or 400 Angstroms and greater to cap the cleaving layer. Once the cleave layer has been capped, the device layer formation undergoes a higher temperature, which deposits such device layer at a higher deposition rate. The higher deposition rate for epitaxial silicon can be 100 Angstroms per second and greater. In a specific embodiment, the second device layer forms to a thickness of greater than about 1,000 Angstroms or greater than about 3,000 Angstroms, but can also be at other thicknesses. The device layer can be formed in at least two steps or a number of steps to facility the manufacture of the device. Additionally, the present deposition methods are generally formed in a single chamber or a clustertool configuration to eliminate any cleaning steps between layer formation. That is, the combination of the cleaving layer and the device layers can be formed in-situ.

Figure 3D:
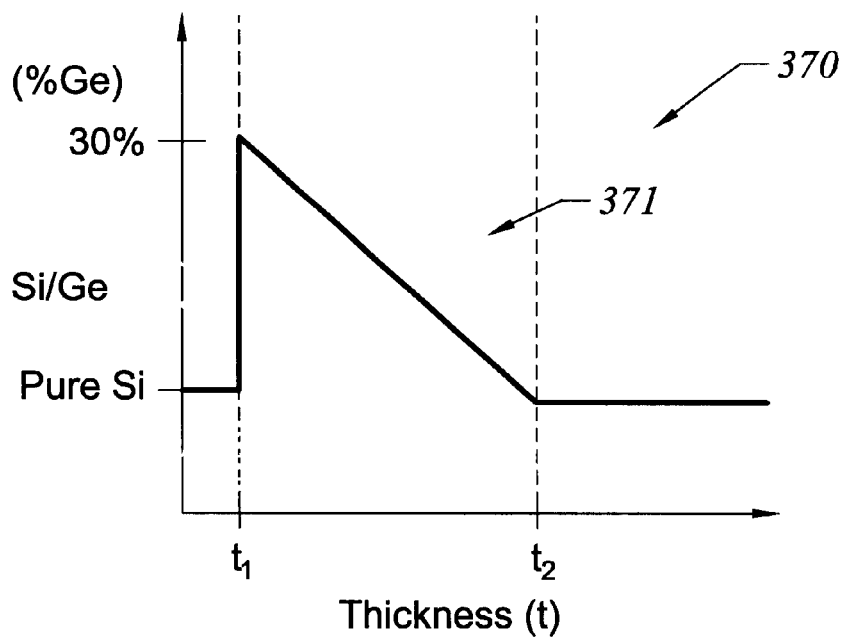
Figure 3E:
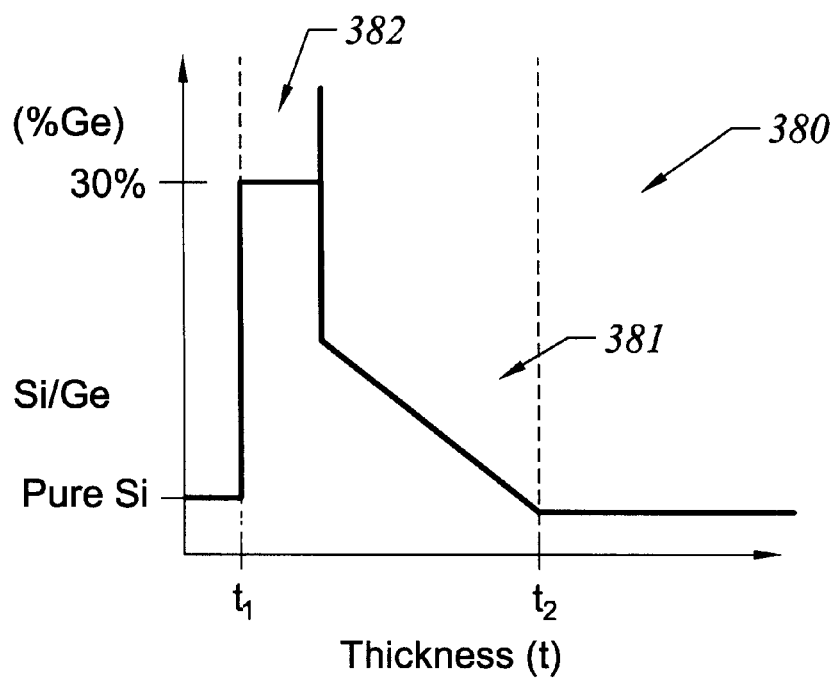

In a specific embodiment, the cleave layer can be deposited using selected concentration profiles, which enhance cleaving. FIGS. 3D to 3E are simplified diagrams of such concentration profiles for cleaving layers according to embodiments of the present invention. As shown, the vertical axis represents concentration of germanium to silicon in percentages and the horizontal axis represents thickness or depth from a surface region to the back side of the substrate. In FIG. 3D, the region represented as reference numeral 371 is the cleaving layer. Here, the concentration of germanium is zero at position t(1), which is also pure silicon. The germanium concentration steps up to a selected concentration (e.g., 30%), the concentration then decreases linearly back down to zero at t(2). Cleaving generally occurs at around position t(1), which has a higher stress than the other regions and would be the location of the cleave plane.

In FIG. 3E, the region represented as reference numeral 381 is the cleaving layer. Here, the concentration of germanium is zero at position t(1), which is also pure silicon. The germanium concentration steps up to a selected concentration (e.g., 30%) and maintains the selected concentration through the region referenced as numeral 382. The germanium concentration then decreases linearly back down to zero at t(2). Cleaving occurs at around position t(1) (the cleave plane location), which has a higher stress than the other regions at some selected implant conditions. Depending upon the application, region 382 can also include a slope, which is linear or curved, depending upon the application.

Generally, the profiles illustrated by the above FIGS. include at least two regions, but may include more depending upon the application. Here, the first region, which is in the vicinity of t(1), is the cleave region (i.e. the cleave plane), which should have a higher stress than the second region, which is between the cleave region and position t(2). The second region is the capture region. The capture region is a portion of the cleave region, which enhances an efficient capture and redistribution of particles implanted within this layer during implantation or subsequent process steps. Once the particles have been captured, they can redistribute to add stress to the cleave region. Details of such introduction of particles are described below.

Figure 4:
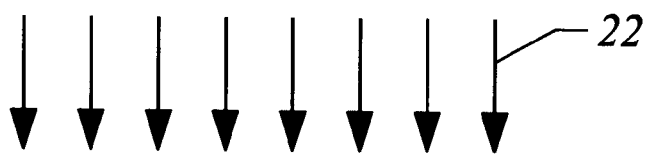
Figure 4:
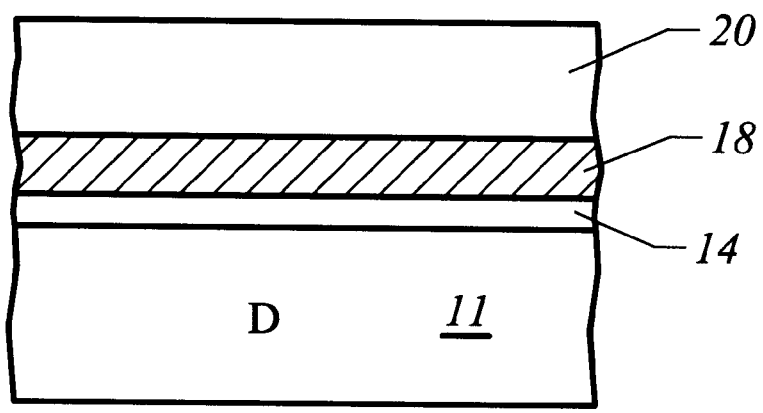

Preferably, the method introduces particles 22 through the device layer into the cleaving layer 18, as shown in FIG. 4. Depending upon the application, smaller mass particles are generally selected to reduce a possibility of damage to the device layer 22. That is, smaller mass particles easily travel through the device layer to the cleaving layer without substantially damaging the device layer that the particles traverse through. For example, the smaller mass particles (or energetic particles) can be almost any charged (e.g., positive or negative) and/or neutral atoms or molecules, or electrons, or the like. In a specific embodiment, the particles can be neutral and/or charged particles including ions such as ions of hydrogen and its isotopes (i.e., deuterium), rare gas ions such as helium and its isotopes, and neon. The particles can also be derived from compounds such as gases, e.g., hydrogen gas, water vapor, methane, and hydrogen compounds, and other light atomic mass particles. Alternatively, the particles can be any combination of the above particles, and/or ions and/or molecular species and/or atomic species. The particles generally have sufficient kinetic energy to penetrate through the surface to a selected depth underneath the surface of the device layer.

Using hydrogen as the implanted species into the silicon wafer as an example, the implantation process is performed using a specific set of conditions. Implantation dose ranges from about $10^{14}$ to about $10^{17}$ atoms/cm$^2$, and preferably the dose is greater than about $10^{15}$ atoms/cm$^2$. Implantation energy ranges from about 1 KeV to about 1 MeV, and is generally about 30 KeV. Implantation temperature ranges from about −200 to about 600° C., and is preferably less than about 400° C. to prevent a possibility of a substantial quantity of hydrogen ions from diffusing out of the implanted silicon wafer and annealing the implanted damage and stress. The hydrogen ions can be selectively introduced into the silicon wafer to the selected depth at an accuracy of about +/−0.03 to +/−0.05 microns. Of course, the type of ion used and process conditions depend upon the application.

In an alternative embodiment, chemical, amorphization, interstitial, and or other stress can be introduced by adding heavier particles to the cleaving layer. Here, the heavier particles include one or any combination of silicon, oxygen, germanium, carbon, nitrogen, or any other suitable heavier particle that can add stress and enhance cleaving. These heavier particles can be implanted through the device layer or can be diffused or the like. In a specific embodiment, a dose requirement for these heavier particles would generally be less than that of lighter particles but do often require higher implant energies than lighter ions to penetrate to the vicinity of the cleave layer. For device layer ranges of 1500–2500 Angstroms or so, implant energies could range from 80–200 keV for ions between the mass range of oxygen and silicon. A combination of heavier and lighter particles can also be used in other embodiments. In these embodiments, virtual no microbubbles or cavities are formed. Additionally, redistribution of such heavier particles may not take place or occurs less than lighter particles. Depending upon the application, many other ways of introducing stress can also be used.

Effectively, the implanted particles add stress or reduce fracture energy along a region parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth. Implantation can occur under conditions such that the energy state of substrate at all internal locations is insufficient to initiate a non-reversible fracture (i.e., separation or cleaving) in the substrate material. It should be noted, however, that implantation does generally cause a certain amount of defects (e.g., micro-defects) in the substrate that can be repaired by subsequent heat treatment, e.g., thermal annealing or rapid thermal annealing.

Figure 4A:
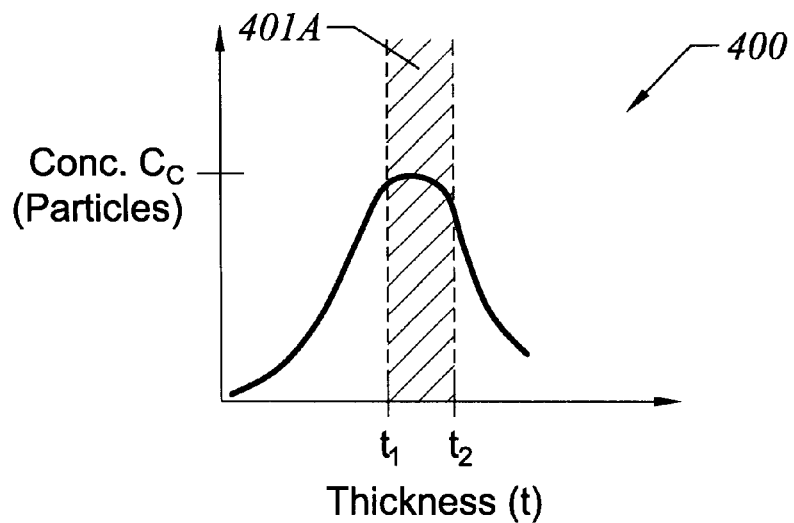
Figure 4B:
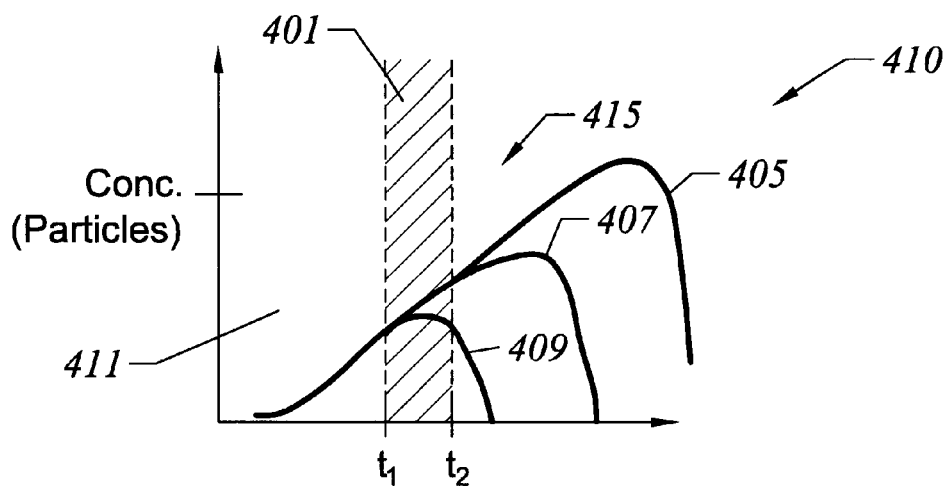

In some embodiments, the particles are introduced into the cleaving layer to achieve a selected dosage to facilitate cleaving. Referring to FIGS. 4A to 4B, the present invention provides selected dosages that can be implanted into the cleaving layer to enhance cleaving. In each of the FIGS. the vertical axis represents concentration of particles, which is referenced a horizontal axis, which represents thickness or depth from a surface of the substrate to the back side of the substrate. The cleaving layer is shown by the cross-hatched lines 401, which are between positions t(1) and t(2). FIG. 4A illustrates the conventional process taught by Bruel generally for comparison purposes only. Here, Bruel's technique introduces a high concentration of hydrogen bearing particles where the maximum dosage intersects the cleaving region, which is a purely implanted layer 401A. Here, a certain amount of dosage ($C_c$) is generally used in the cleaving layer to facilitate the Bruel method. The Bruel method uses a high concentration of hydrogen to form microbubbles, which form even larger bubbles, which blister, splinter, and separate the film during thermal treatment. This high concentration generally is undesirable since it causes excessive surface roughness and other defects, which the present invention overcomes. Additionally, thermal treatment at high temperature is also generally undesirable, since it causes defects.

Referring to FIG. 4B, the present method uses a selected low dosage of hydrogen bearing particles, which occupy a region between position t(1) and t(2). The cleaving layer referenced as numeral 401 comprises a deposited silicon germanium layer and implanted particles, which are in a low dose. The dose is defined as an amount that is substantially free from the formation of microbubbles, which can lead to even larger bubbles, which blister, splinter, and separate the film. The dose generally should be a certain amount of particles that occupy the region in the cleaving layer. Regions outside the cleaving layer can have a higher dose, but generally do not directly participate in the cleaving process.

As shown, the particle distribution profile can include, for example, those shown by reference numbers 409, 407, and 405. Profile 405 generally has a higher overall dose than either profile 407 or 409, which has the lowest overall dose. The higher dose occupies region 415, which is outside of the device layer 411, thereby reducing a possibility of high dosage damage to the device layer. The cleaving layer has a relatively constant amount of dosage in these examples. The constant amount of dosage is maintained where damage to the device layer is reduced. In these embodiments, a maximum dosage region falls outside of the cleave layer, which is substantially different from the conventional Bruel process where a maximum dosage region is necessarily in close proximity and directly contributes to the conventional blistering cleaving processes. Therefore, it is a fundamental characteristic of the Bruel blistering processes that the cleave plane will be at or very near to the implant peak in a region where the microcavities and microbubbles coalesce to develop a fracture plane.

Preferably, the cleaving layer has a suitable characteristic for cleaving after implantation. The cleaving layer is a stressed layer. The stressed layer is thermally stable after implantation, since it is preferable that dislocations are not formed in the stressed layer after its formation. That is, dislocations are generally not desirable. These dislocations can come in the form of slip planes, stacking faults, dislocations, and the like, which can often combine and form larger structures during a thermal treatment process. The present cleaving plane is also free from microbubbles or microcavities, which can form macrobubbles, and separation. Accordingly, the implantation often must be carried out in a manner and a dose to prevent such dislocations in preferred embodiments.

Once particles have been introduced into the cleaving layer, the donor substrate can be bonded to a handle substrate. Here, optionally, a step of low temperature plasma activation can be used to clean faces of the substrates. Then, the substrates are bonded together. A thermal treatment step can follow the bonding step to improve bond integrity. In a specific embodiment, the thermal treatment step temperature/time combination can also cause the particles to redistribute to each of the interfaces between the cleaving layer and the device layer (and the stop layer or substrate). The thermal treatment step redistributes such particles after implantation to form at least one maximum peak (or more can be formed) near the interfaces of the cleaving layer. In an embodiment using a silicon germanium cleaving layer and an epitaxial silicon device layer, the present invention provides a higher maximum in the interface between the silicon germanium and the epitaxial layer or the other interface. In certain embodiments, the particles can also redistribute during implantation or other thermal process time/temperature combinations.

Figure 5:
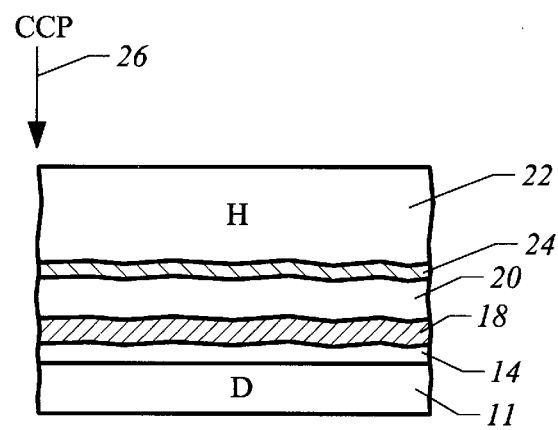

A controlled cleaving process is performed, as shown in FIG. 5. Here, the donor substrate 11 has been bonded to a handle substrate 22. Bonding can occur using a variety of techniques to attach substrate 11 to substrate 22. In a specific embodiment, a silicon dioxide layer 24 can be used to attach these substrates together to form a multilayered substrate structure. In a specific embodiment, the bonded substrates undergo a step of selective energy placement or positioning or targeting which provides a controlled cleaving action at the stressed region along the cleave plane. In preferred embodiments, selected energy placement occurs near an edge or corner region of the stressed region of substrate. The impulse or impulses are provided using energy sources. Examples of sources include, among others, a chemical source, a mechanical source, an electrical source, and a thermal sink or source. The chemical source can include a variety such as particles, fluids, gases, or liquids. These sources can also include chemical reaction to increase stress in the stressed region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid source, a liquid source, a gas source, an electro/magnetic field, an electron beam, a thermoelectric heating, a furnace, and the like. The thermal sink can be selected from a fluid source, a liquid source, a gas source, a cryogenic fluid, a super-cooled liquid, a thermo-electric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. In a specific embodiment, the energy source can be a fluid source that is pressurized (e.g., compressional) according to an embodiment of the present invention. A detailed discussion of such a pressurized fluid source is described in U.S. Ser. No. 09/370,975, which is incorporated by reference herein.

Figure 6:
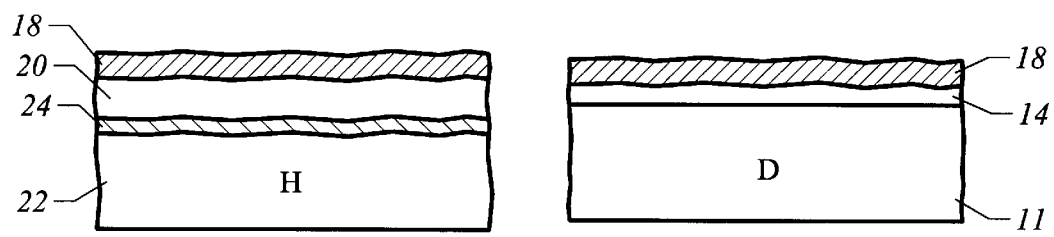

As shown, cleaving separates the donor substrate from the handle substrate, where the device layer is attached to the donor handle substrate, as shown in FIG. 6. As shown, each of the substrates includes a portion 18 of the cleaving layer. The cleaving layer is selectively removed from the handle wafer substrate. Here, such selective removal process can include dry or plasma etching, wet etch, polishing, or any combination of these. In one embodiment, the removal process uses a concentrated solution of hydrogen fluoride, which is mixed with nitric acid and acetic acid. Alternatively, the removal process uses a concentrated solution of hydrofluoric acid, which is mixed with hydrogen peroxide and acetic acid. The selectivity of such solution is preferably greater than about 100:1 or greater than about 200:1 (etch rate of cleaving layer to etch rate of stop layer).

Figure 7:
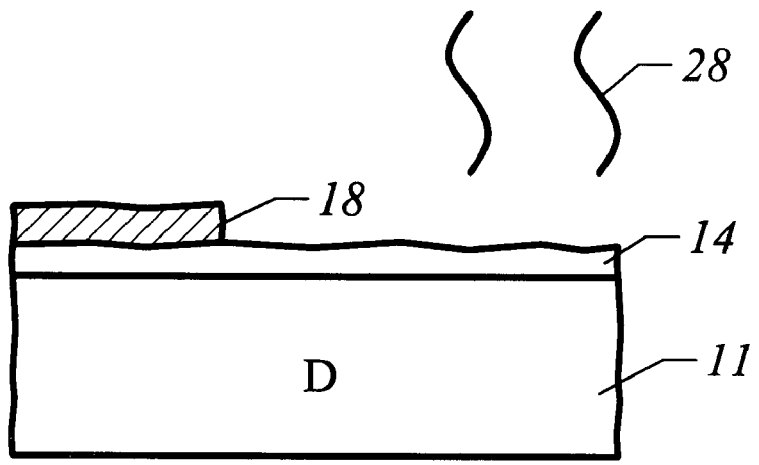

The cleaving layer is selectively removed from the donor substrate, as shown in FIG. 7. A similar selective removal process can be used to remove the cleaving layer from the donor substrate. Here, such selective removal process can include dry or plasma etching, wet etch, polishing, or any combination of these. In one embodiment, the removal process uses a concentrated solution of hydrogen fluoride, which is mixed with nitric acid and acetic acid. Alternatively, the removal process uses a concentrated solution of hydrofluoric acid, which is mixed with hydrogen peroxide and acetic acid. The selectivity of such solution is preferably greater than about 100:1 or greater than about 200:1 (etch rate of cleaving layer to etch rate of stop layer).

Figure 8:
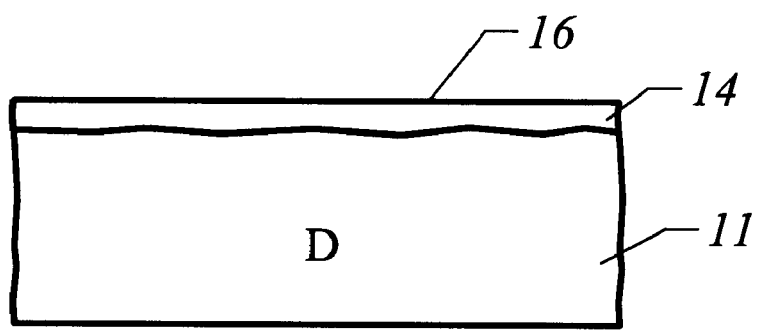
Figure 9:
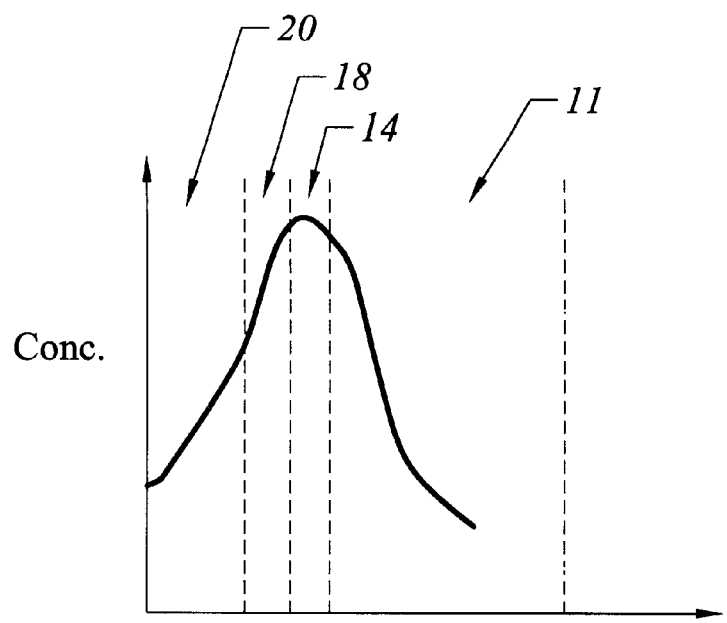

Once the cleaving layer has been removed, the stop layer is exposed, as shown in FIG. 8. Here, the top surface 16 of the stop layer is exposed and substantially free from defects. The donor substrate with stop layer can be reused in another substrate fabrication process. In other embodiments, the stop layer is removed in a selective manner. In these embodiments, there may be some implant damage in the stop layer, which should be taken out before formation of a cleaving layer thereon. The stop layer is selectively removed from the donor substrate to expose the top surface of it. Now, the donor substrate is ready for another series of processing steps to form a multilayered substrate structure. In a specific embodiment, the stop layer can be removed. A smoothing step may follow the removing process. Alternatively, the stop layer can be smoothed using a combination of hydrogen treatment and heat treatment. An example of such smoothing process is described in U.S. Ser. No. 09/295,858, commonly assigned, and hereby incorporated by reference for all purposes.

Figure 10:
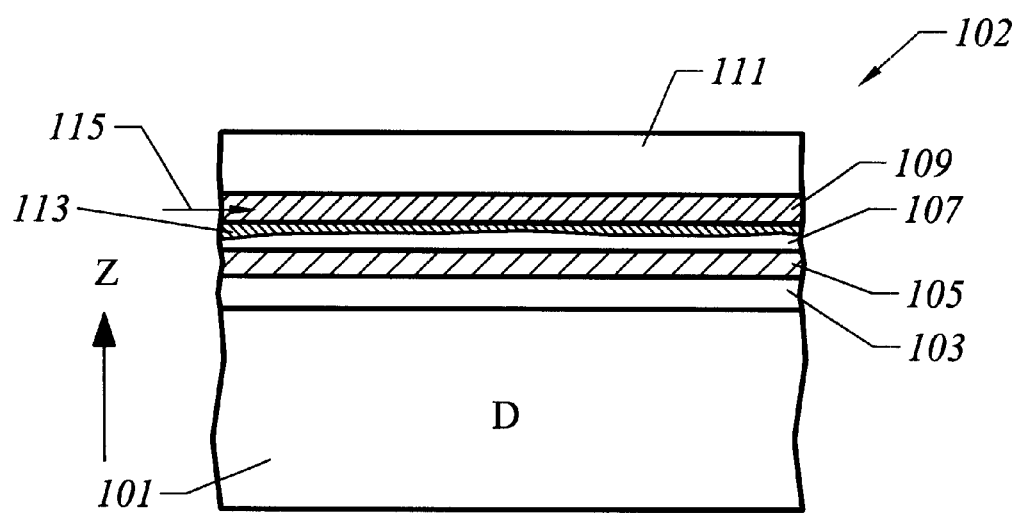

In an alternative embodiment, the present process can be repeated to form a multilayered donor substrate structure 100 of FIG. 10. Here, the donor substrate structure 100 includes a stop layer 103 overlying the donor substrate. A cleaving layer 105 is formed overlying the stop layer 103. Another stop layer 107 is formed overlying the cleaving layer and another cleaving layer is formed overlying the stop layer 107. A device layer 111 is formed overlying the cleaving layer. In a specific embodiment, the implant of particles can be selectively adjusted along the z-direction of the substrate structure, where a higher dose is provided to either cleaving layer 109 or cleaving layer 105. Depending upon where the higher dose is provided, cleaving can occur at cleaving layer 109 or cleaving layer 105. If the implant profile provided a high concentration region 113, cleaving would occur at cleaving plane 115 in a specific embodiment. Cleaving can occur using a variety of technique such as the CCP described in U.S. Ser. No. 09/370,975, which is commonly owned and incorporated by reference herein.

Figure 11:
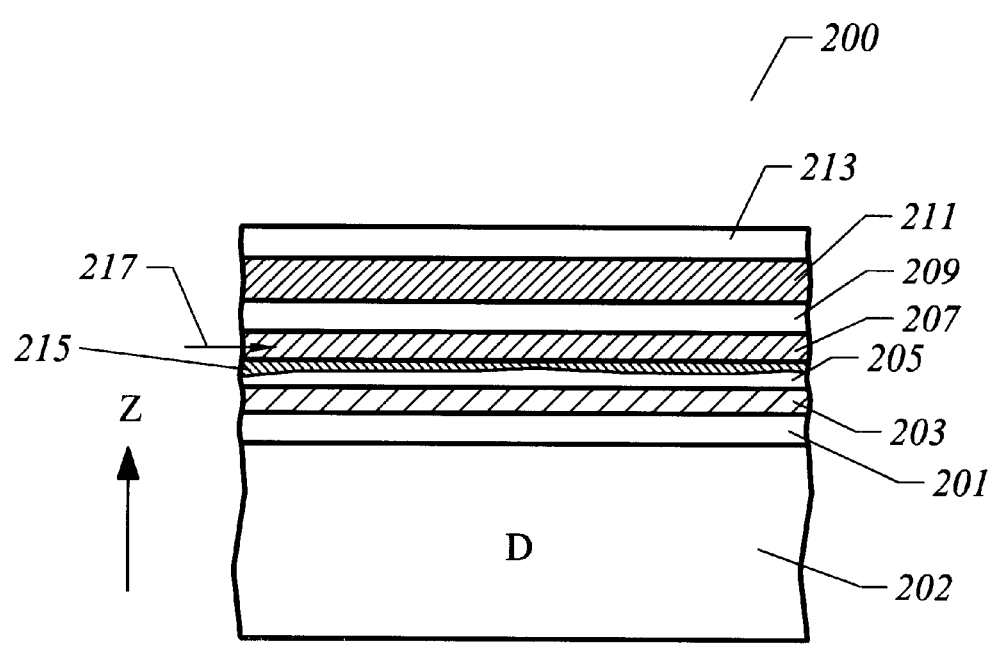
Figure 12:
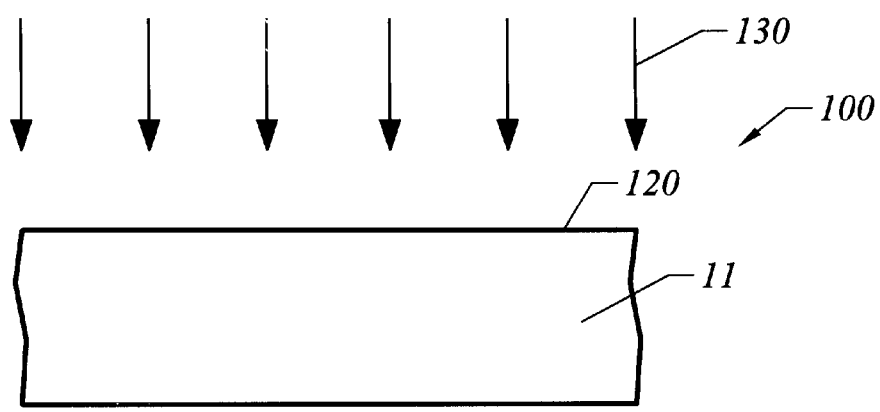

In an alternative embodiment, the present process can be repeated to form a multilayered donor substrate structure 200 of FIG. 11. Here, the donor substrate structure 200 includes bulk substrate 202. Overlying bulk substrate is a stop layer 201. A cleaving layer 203 is formed overlying the stop layer 201. Another stop layer 205 is formed overlying the cleaving layer and another cleaving layer 207 is formed overlying the stop layer 205. An nth stop layer 209 is formed overlying the cleaving layer. An nth cleaving layer is formed overlying the nth stop layer. A device layer 213 is formed overlying the cleaving layer. In a specific embodiment, the implant of particles can be selectively adjusted along the z-direction of the substrate structure, where a higher dose is provided to either of the cleaving layers. Depending upon where the higher dose is provided, cleaving can occur at a particular cleaving layer. If the implant profile provided a high concentration region 215, cleaving would occur at cleaving plane 217 in a specific embodiment. Cleaving can occur using a variety of technique such as the CCP described in U.S. Ser. No. 09/370,975, which is commonly owned and incorporated by reference herein.

Optionally, the present method uses a selective pattern distribution technique of particles in the cleaving layer to enhance cleaving, as illustrated in diagrams of FIGS. 12 to 15. These diagrams are merely examples, which should not limit the scope of the claims herein. One of ordinary skill in the art would recognize many other variations, modifications, and alternatives. Some of the reference numerals used herein are similar to the previous ones for cross referencing purposes only. As shown, the present method begins by providing substrate 11, which can be a substrate such as the one in FIG. 4, as well as others. That is, it is not necessary that the cleave layer include a deposited layer. The cleave layer can be solely an implanted layer, where particles 130 have been introduced into the substrate.

Figure 13:
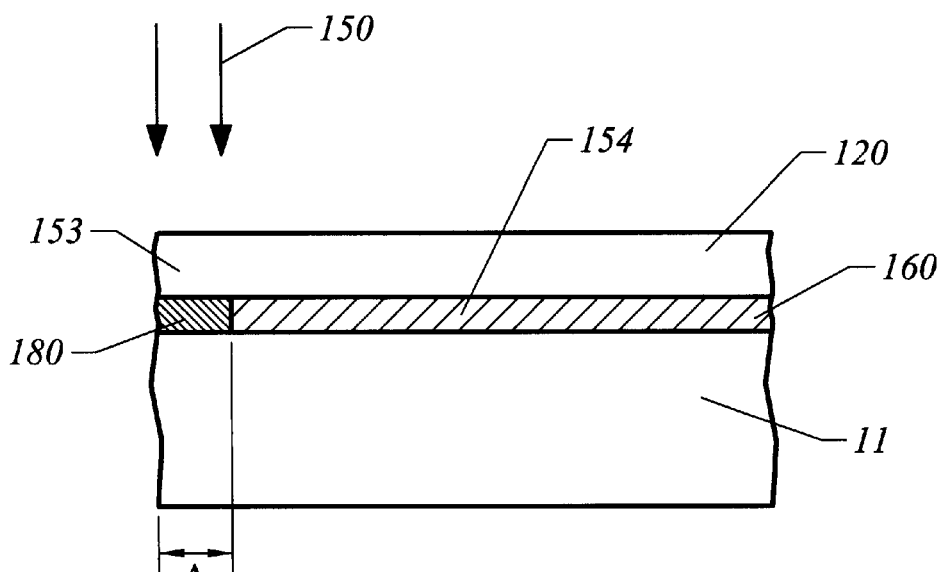
Figure 14:
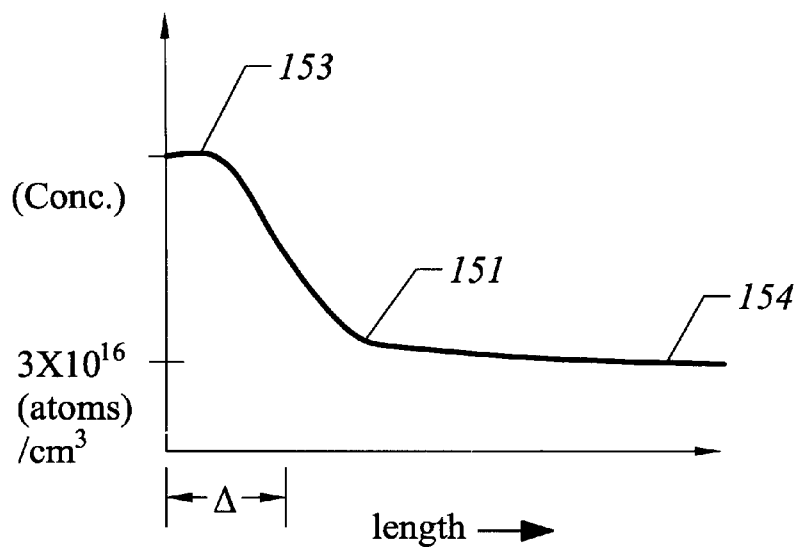
Figure 15:
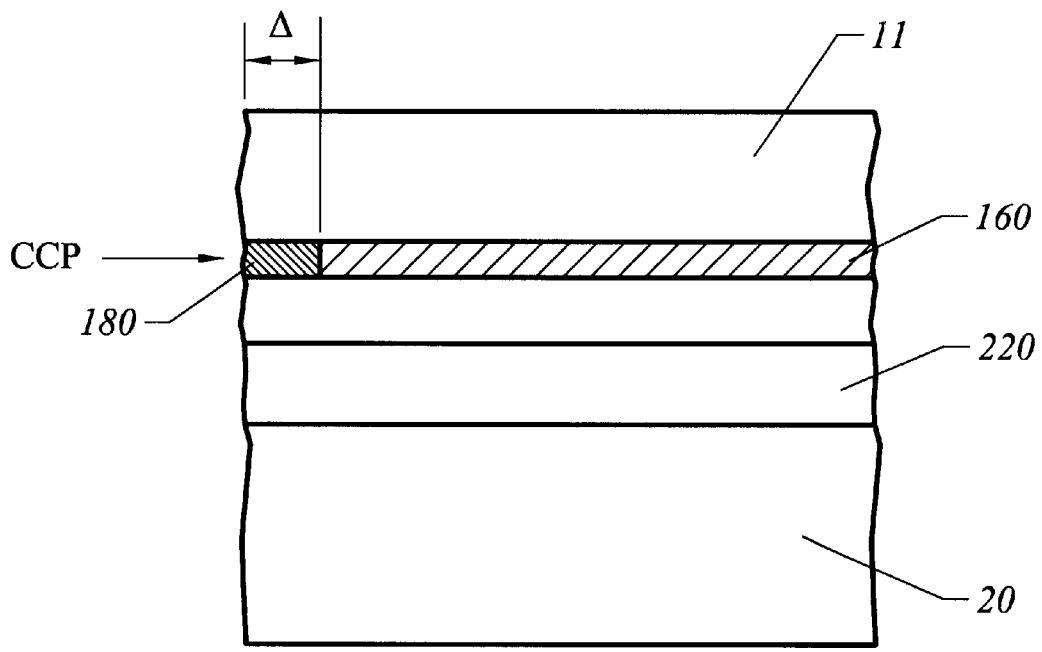

Once the cleave layer has been formed, the method yields a substrate such as the one in FIG. 13. As shown are substrate 11, cleave layer 160, and device layer 120, which can be silicon, epitaxial silicon, or another material. Particles 150 are selectively introduced into an edge region 180 of the cleave layer in another implantation step or a second stage (or another stage) of the implantation step of introducing particles 22. The edge region can be only on one end of the substrate. Alternatively, the edge region can be around a periphery of the substrate. The edge region is generally a higher concentration region, which is used to facilitate cleaving or initiation of cleaving. The edge region extends from an outer edge of the substrate to a length delta, as shown. A profile 151 of the edge region is illustrated by a simplified diagram in FIG. 14. Here, the diagram includes a vertical axis, which plots concentration, and a horizontal axis, which plots length from the edge 153 of the substrate to a center region 154 of the substrate. The distribution of particles can include a step distribution, a graded distribution, or any other distribution, which facilitates cleaving or initiation of cleaving.

Once the substrate has been selectively implanted, substrate 11 is bonded to substrate 20. The substrates can be bonded to each other through interface 220, which can be silicon dioxide or the like. Many other types of interfaces can also be used. Here, a controlled cleaving process can be used. Other types of cleaving techniques can also be used depending upon the application.

The present invention also provides many advantages and/or benefits over conventional processes. For example, the present invention can be substantially free from the use of porous silicon or masked area in some embodiments. Accordingly, the present device layer would therefore be of a higher quality than conventional layers. Additionally, the present invention provides for a higher quality epitaxial layer, which is formed on a high quality cleave layer that is generally free from dislocations and the like. In other embodiments, the present cleave layer comprises a non-contaminating, process compatible and miscible with a single crystal alloy. Here, the present process can be performed through the use of a clustertool system, which allows for an in-situ process for forming a stop layer, a cleaving layer, a device layer, or any combination of these. Additionally, the present cleave layer can be stable (e.g., thermally) under subsequent processing and allow high-temperature steps (e.g., greater than 400 degrees Celsius, or greater than 500 degrees Celsius) such as oxidation to be performed. Furthermore, the use of low doses of an implanted specie provides for higher productivity (e.g., two times, three times, or five times and greater) and lower device layer damage Dose/implant depth process tradeoff would also generally allow the cleave plane and device layer to be physically separated from the implant peak and end-of-range (EOR) damage, which prevents damage to the device layer from any thermal treatment, if any. The present invention also provides a process where the cleave layer, after separation at the cleave plane, allows selective etching to remove the cleave layer material using conventional etching chemicals. Depending upon the embodiment, one or more of these benefits may exist.

Although the above has been generally described in terms of a specific substrate, many others can also exist. These substrates can include, among others, gallium arsenide, quartz, and silicon carbide. Of course, the type of substrate used depends upon the application.

EXAMPLE

To prove the principle and operation of the present invention, an experiment was performed. In this experiment, we used eight-inch bulk CZ wafers. These wafers were prime low boron concentration wafers from Mitsubishi Silicon America. The wafers were cleaned using a conventional SC1 and SC2 clean. Next, the wafers were dried using a conventional spin rinse dry so that the wafers were free from liquid droplets. Each wafer was loaded into an epitaxial silicon reactor. The reactor was a tool made by ASM International of Phoenix, Ariz., but is not limited to such reactor. A high temperature bake at about 1,100 Celsius was performed on the wafer. This bake removed native oxide and cleaned faces of the wafer. The bake was followed by a deposition process, where about 2,000 Angstroms of epitaxial silicon was deposited. Such deposition was provided by a combination of silane and hydrogen gases in a conventional manner.

Next, the method used a deposition of silicon germanium overlying the epitaxial silicon. The silicon germanium was introduced into the same chamber as the epitaxial silicon, where the wafer remained. The gases used included germane ($GeH_4$) and silane gases. The silicon germanium was about 30% germanium and about 70% silicon. Other concentrations of germanium can also be used. Hydrogen gas continued to be introduced during the introduction of the germane and silane gases. Such introduction occurred in-situ, where the wafer was not allowed outside of the chamber to prevent a possibility of contamination on the surface of the epitaxial silicon layer. Here, a continuous growth process of the stop layer and the cleaving layer was provided. The silicon germanium was grown at a temperature that prevented misfits and other structural defects. Such temperature is about 700 degrees Celsius and less. In this experiment, the cleave layer thickness was about 200 Angstroms.

Next, the method used a deposition of epitaxial silicon overlying the silicon germanium layer. Here, germane gas was turned off in the chamber, while the silane and hydrogen gases were allowed to continue to enter the chamber. A higher flow rate of such gases could be introduced to improve deposition rates. The epitaxial silicon layer was growth to a thickness of 2200 Angstroms.

Once the deposition processes were completed, the wafer was implanted. Optionally, the surface of the epitaxial silicon can be oxidized, where a thermal oxide layer of about 1000 Angstroms is grown. The implantation process was provided in a hydrogen implanter. The implanter was a conventional Varian implantation apparatus, but is not limited to such apparatus. The hydrogen was introduced at a dose of about $3\times10^{16}$ atoms/cm$^2$ at an energy of about 22 keV. It is believed that the hydrogen increases stress in the silicon germanium layer. In some recent experiments, doses of less than $8\times10^{15}$ atoms/cm$^2$ at an energy of about 22 keV were also shown to cleave. Lower doses can be realized through the use of thicker cleave layers.

The implanted surface of the substrate was then bonded to a handle wafer. Here, the faces of each of the substrates were plasma activated using an oxygen plasma. Next, the faces were brought together and bonded to each other form a suitable bond that does not separate during the present cleaving method. Bonding was perfected using a thermal treatment process of 350 degrees Celsius for 2 hours which enhanced the bond. The thermal treatment process occurred and was maintained at a temperature below gaseous microbubble or microcavity formation along the cleave plane. Additionally such treatment process occurred at such temperature below crystalline rearrangement (e.g., blistering), surface morphology change, or separation of the implanted material. It has been found that such blistering and high temperature caused film quality problems and the like, which have been undesirable. In fact, it is generally understood that the blister process no longer functions for doses below $3.5\times10^{16}$ atoms/cm$^2$ at any implant energies and about $4.4\times10^{16}$ atoms/cm$^2$ at about 22 keV under any thermal treatment temperatures and times.

Figure 16:
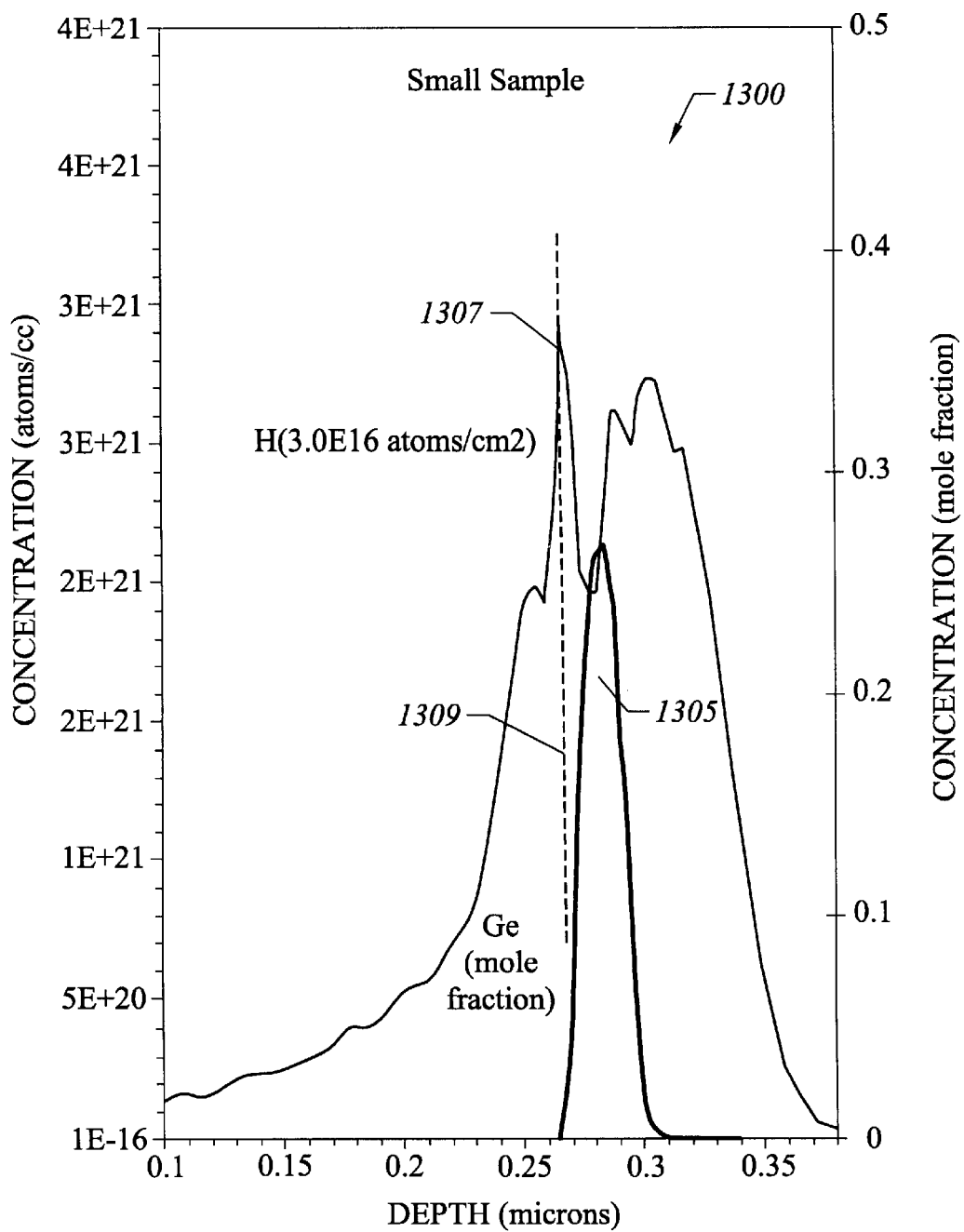
FIGS. 16–18 are simplified diagrams of experimental results according to embodiments of the present invention

An example of an implant profile is shown in FIG. 16, which is a simplified diagram 1300 of an experimental result according to an embodiment of the present invention. This diagram is merely an example. There could be many other variations, modifications, and alternatives. The diagram plots concentration (atoms/cubic centimeters) along the vertical axis and a horizontal axis, which is depth. Such depth extends from the top surface of the device layer, through the cleave layer, and to the substrate. As shown, the diagram illustrates a plot of hydrogen ions 1301, which has a maximum concentration 1307. The cleaving layer 1305, which is silicon germanium, is also shown. Upon cleaving, the cleaving layer separates the device layer from the substrate in a region defined as the cleave plane shown by reference numeral 1309. Such region accumulates hydrogen , which increases interfacial stress, which facilitates cleaving. Cleaving occurred in a cleaving apparatus, such as the one described in U.S. Ser. No. 09/371,906, which is incorporated by reference herein. Once cleaving separated the two substrates from each other, the cleaving process was terminated. Any remaining cleaving layer (i.e., silicon germanium) was selectively removed from the stop layer, which was epitaxial silicon.

Figure 17:
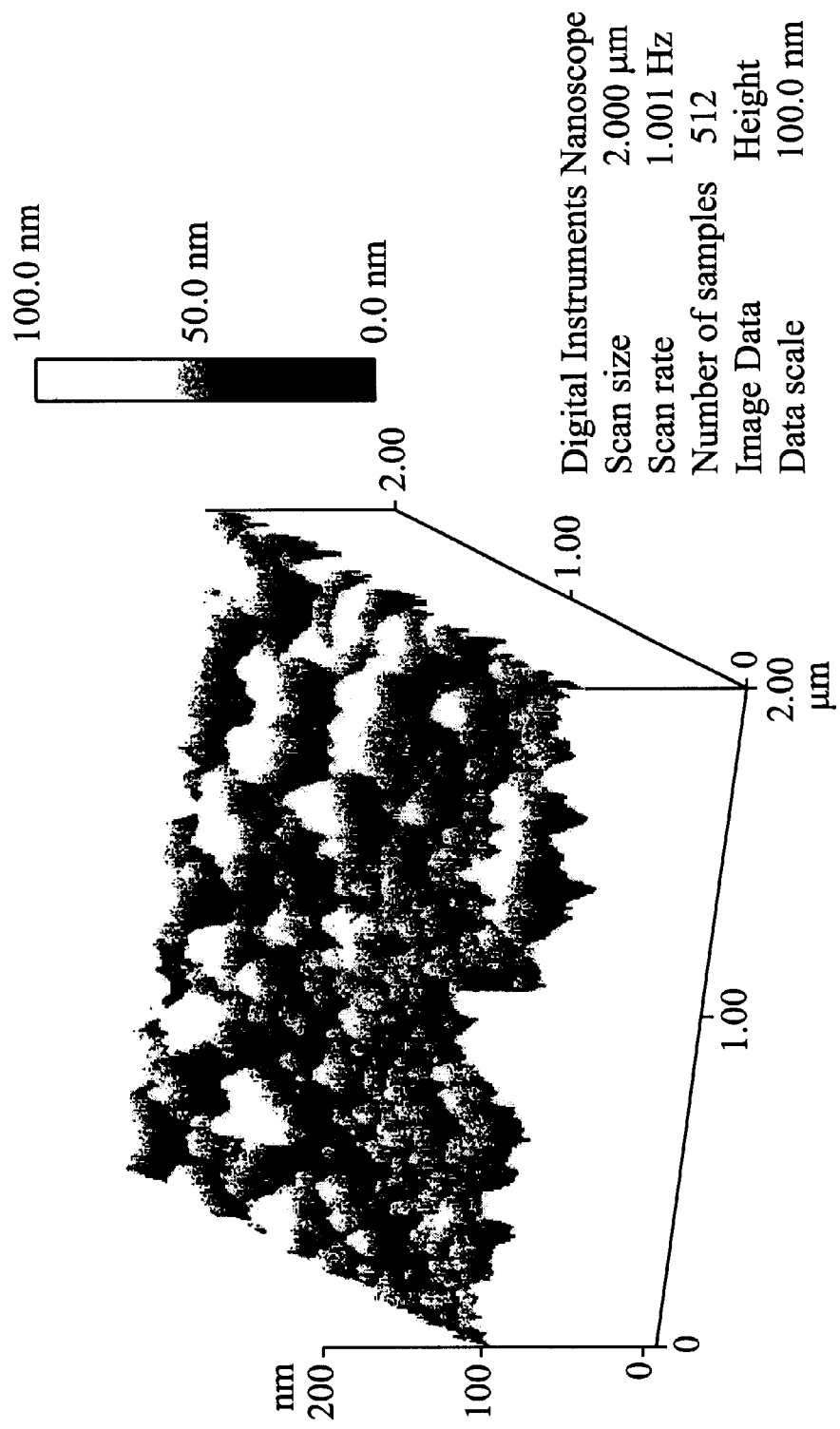
Figure 18:
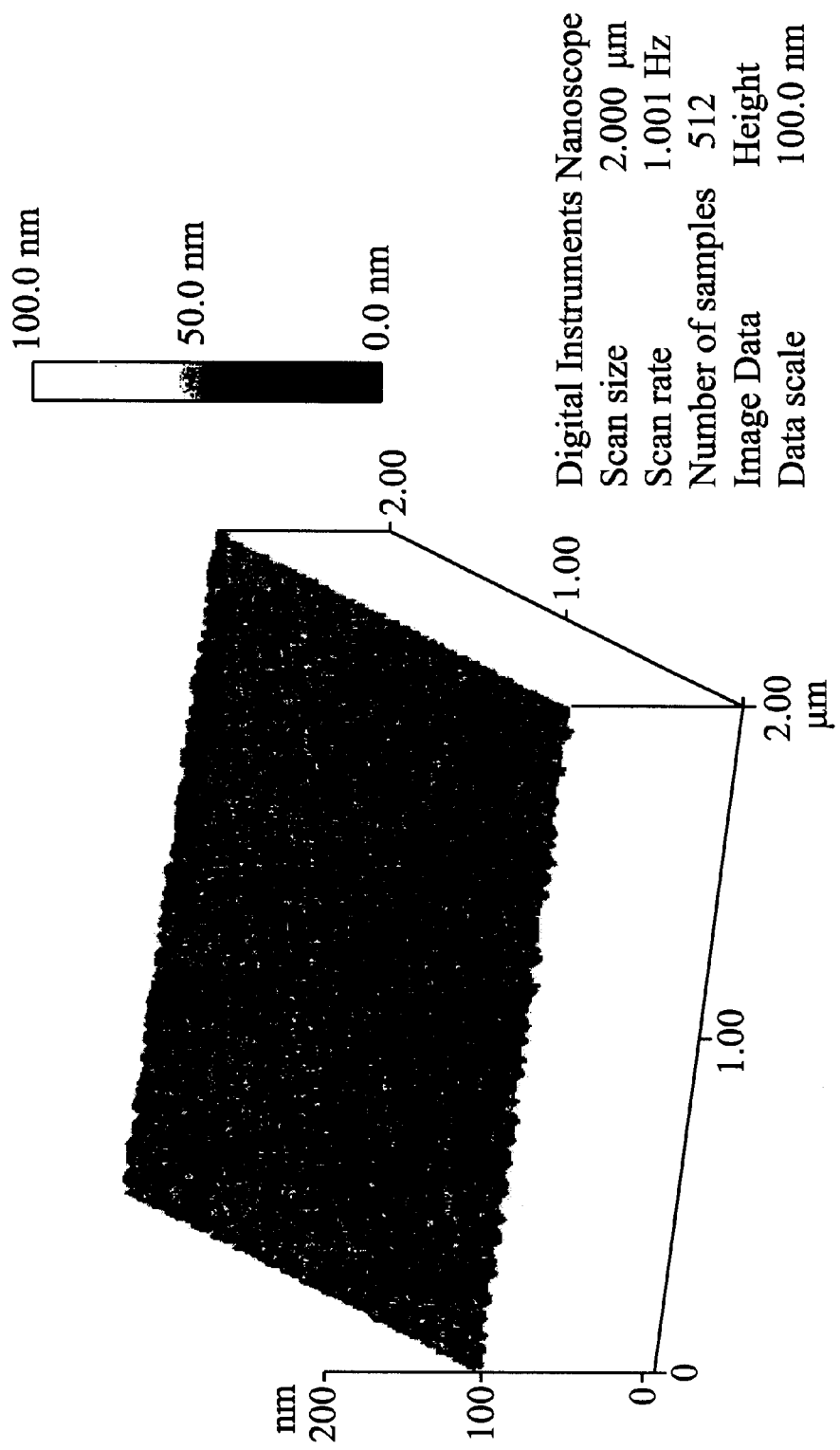

FIGS. 17 and 18 are micrographs of surface roughness of cleaved films. Referring to FIG. 17, surface roughness of a conventional blister separation process known as Smart Cut™ was performed. Such conventional process uses high doses of hydrogen ($>6\times10^{16}$ atoms/cm$^2$ at about 22 keV), which is implanted into a substrate. The substrate is bonded and then subjected to high temperature. The high temperature provides microbubbles, which turn into macrobubbles, which ultimately blister a device layer from the substrate. Since such high concentrations and high temperatures are used, the surface roughness often is about 80 Angstroms RMS and greater. In contrast, the present process using a controlled cleaving process, which uses a silicon germanium cleaving layer. The present process provides a much smoother surface than the conventional process. Here, we measured a surface roughness value of 10 to 12 Angstroms RMS. After stripping the cleaving layer, the surface roughness was about 4 to 6 Angstroms RMS. Accordingly, the present process provides much smoother films than conventional processes due to a substantially different physical mechanism in cleaving. The present experiment demonstrates many of the aspects of the present invention described herein. This experiment, however, is not intended to unduly limit the scope of the claims herein. One of ordinary skill in the art would recognize many variations, alternatives, and modifications.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method of forming substrates, the method comprising:

providing a donor substrate;

forming a cleave layer comprising a cleave plane on the donor substrate, the cleave plane extending from a periphery of the donor substrate through a center region of the substrate;

forming a device layer on the cleave layer, the device layer comprising an epitaxial material;

selectively introducing a plurality of particles along the periphery of the cleave plane to form a higher concentration region at the periphery and a lower concentration region in the center region;

providing selected energy to the donor substrate to initiate a cleaving action at the higher concentration region at the periphery of the cleave plane to cleave the device layer at the cleave plane.

2. The method of claim 1 further comprising bonding the device layer of the donor substrate to a handle wafer after introducing the particles.

3. The method of claim 1 wherein the cleave layer comprises silicon germanium, the silicon germanium in the cleave layer comprising at least 10% germanium content in the silicon germanium alloy.

4. The method of claim 1 wherein the substrate comprises a stop layer underlying the cleave layer.

5. The method of claim 1 wherein a cleaved surface of the device layer comprises a surface roughness of less than about 20 Angstroms RMS.

6. The method of claim 1 wherein the particles are selected from hydrogen ions, deuterium ions, helium ions, or other light atomic mass species.

7. The method of claim 4 wherein the stop layer comprises a first stop layer overlying the substrate, a first silicon germanium layer overlying the first stop layer, and a second stop layer overlying the first silicon germanium layer.

8. The method of claim 1 wherein the cleave layer comprising a particle collection region and a cleave region.

9. The method of claim 1 wherein the cleave layer comprises a graded concentration of the silicon germanium.

10. The method of claim 9 wherein the graded concentration is greater near the device layer and decreases toward the donor substrate.

11. The method of claim 1 wherein the donar substrate is a silicone substrate having <100> crystal orientation.

12. The method of claim 1 wherein the particles are hydrogen ions.

* * * * *